(12) United States Patent
Meissner et al.

(10) Patent No.: US 6,448,776 B2
(45) Date of Patent: Sep. 10, 2002

(54) METHOD FOR MEASURING FITNESS FOR USE OF A STORAGE BATTERY SUBJECT TO ELECTRIC LOADING

(75) Inventors: Eberhard Meissner, Wunstorf; Sigmar Bräuninger, Garbsen, both of (DE)

(73) Assignee: VB Autobatterie GmbH (DE)

( * ) Notice: Subject to any disclaimer, the term of this patent is extended or adjusted under 35 U.S.C. 154(b) by 0 days.

(21) Appl. No.: 09/758,481

(22) Filed: Jan. 11, 2001

(30) Foreign Application Priority Data

Jan. 11, 2000 (DE) .......................................... 100 00 729

(51) Int. Cl.$^7$ ............................................. G01N 27/416
(52) U.S. Cl. ....................................... 324/426; 324/425
(58) Field of Search .............................. 324/426, 425; 320/134, 136, 137, 127, 128

(56) References Cited

U.S. PATENT DOCUMENTS 5,160,851 A * 11/1992 McAndrews ................. 307/66
6,255,803 B1 * 7/2001 Ishihara et al. ............. 320/134

FOREIGN PATENT DOCUMENTS

| DE | 22 42 510 | 6/1976 |
|----|-----------|--------|
| DE | 40 07 883 A1 | 9/1991 |
| DE | 39 01 680 C2 | 5/1993 |
| DE | 43 39 568 A1 | 5/1995 |
| DE | 195 43 874 A1 | 5/1996 |

* cited by examiner

Primary Examiner—Bao Q. Vu
Assistant Examiner—Lawrence Luk
(74) Attorney, Agent, or Firm—Schnader Harrison Segal & Lewis LLP

(57) ABSTRACT

A method for measuring fitness for use of a storage battery subject to electric loading including determining a load profile (current profile I(t) or power profile P(t)) as a function of time t, for the storage battery, recording an actual voltage response U(t) of the storage battery to the load profile or calculating a voltage response U(t) of the storage battery to the load profile, and determining a fitness for use value SOH for the storage battery based on the difference between a lowest (highest) voltage value Umin (Umax) during application of the load profile to the storage battery, and based on a voltage limiting value U1, wherein U1 is a voltage value which may not be undershot (overshot) by the voltage U(t) at any time t during which the load profile is applied to the storage battery.

21 Claims, 1 Drawing Sheet

METHOD FOR MEASURING FITNESS FOR USE OF A STORAGE BATTERY SUBJECT TO ELECTRIC LOADING

FIELD OF THE INVENTION

This invention relates to a method for measuring the fitness for use of a storage battery in the case of electric loading of the storage battery.

BACKGROUND

It is particularly important for users of batteries to know the state of charge and high-current loadability of the batteries. For example, the state of charge and the aging state, or the drop in capacity beginning to be shown by the battery, are decisive for the ability of a starter battery to start a motor vehicle having an internal combustion engine, since the current strength which can be drawn from the starter battery, or the power output thereof, is limited by such ability. It is particularly important to determine the state of charge or the starting ability of a battery in cases in which, for example, intermittent engine operation occurs. This is because, in times of engine standstill, the vehicle electrical network, with its consumers of electricity, continues to operate even though the generator is not generating current. Monitoring the charge and starting ability of the battery must ensure in such cases that the energy content of the battery remains sufficient to start the engine.

The most varied methods are known for measuring the state of charge of storage batteries. In many cases, integrated measuring instruments are used (Ah meters), account being taken of the charging current, if appropriate with evaluation using a fixed charging factor. Since the useful capacity of a battery depends strongly on the magnitude of the discharging current and the temperature, these methods are also incapable of providing satisfactory statements on the useful capacity which can still be extracted from the battery.

For example, it is known from DE-C 2242510 to use a factor which depends on the temperature and the state of charge of the battery itself to evaluate the charging current with the use of a method for measuring the state of charge.

DE-A 4007883 discloses a method in which the starting ability of a storage battery is determined by a measurement of storage battery voltage and battery temperature and comparison with a family of state of charge curves valid for the type of battery to be checked.

DE-A 19543874 discloses a method of calculation for the discharging characteristic and measurement of the residual capacity of a battery in the case of which current, voltage and temperature are likewise measured, the discharging characteristic being approximated by a mathematical function with a curved surface.

DE-C 3901680 describes a method for monitoring the cold starting ability of a starter battery, wherein the starter battery is temporarily loaded with a resistor, the voltage dropping across the resistor is measured, and it is established therefrom by comparison with empirical values whether the cold starting ability of the battery is still sufficient. The starting operation serves in this case to load the starter battery.

Finally, DE-A 4339568 discloses a method for determining the state of charge of a motor vehicle starter battery wherein the battery current and open-circuit voltage are measured and used to infer the state of charge, the battery temperature also being taken into account in addition. In this case, the charging currents measured during various time intervals are compared and a residual capacity is determined therefrom.

However, determining the state of charge does not always suffice, in particular, since it is to be taken into account, for example, that in the case of a greatly aged battery the voltage will collapse upon loading despite an adequate state of charge and, thus, the usefulness of the battery is not ensured.

Accordingly, it would be advantageous to be able to determine the characteristic of the battery which goes beyond establishing the battery charge and from which it is possible to infer the battery's fitness for use.

SUMMARY OF THE INVENTION

The invention relates to a method for measuring fitness for use of a storage battery subject to electric loading comprising: determining a load profile (current profile $I(t)$ or power profile $P(t)$) as a function of time t for the storage battery; recording an actual voltage response $U(t)$ of the storage battery to the load profile or calculating a voltage response $U(t)$ of the storage battery to the load profile; and determining a fitness for use value SOH for the storage battery based on the difference between a lowest (highest) voltage value Umin (Umax) during application of the load profile to the storage battery, and based on a voltage limiting value U1, wherein U1 is a voltage value which may not be undershot (overshot) by the voltage $U(t)$ at any time t during which the load profile is applied to the storage battery.

BRIEF DESCRIPTION OF THE DRAWING

The drawing is a graph of $U(t)$ and $I(t)$ versus time.

DETAILED DESCRIPTION OF THE INVENTION

Figure 1:
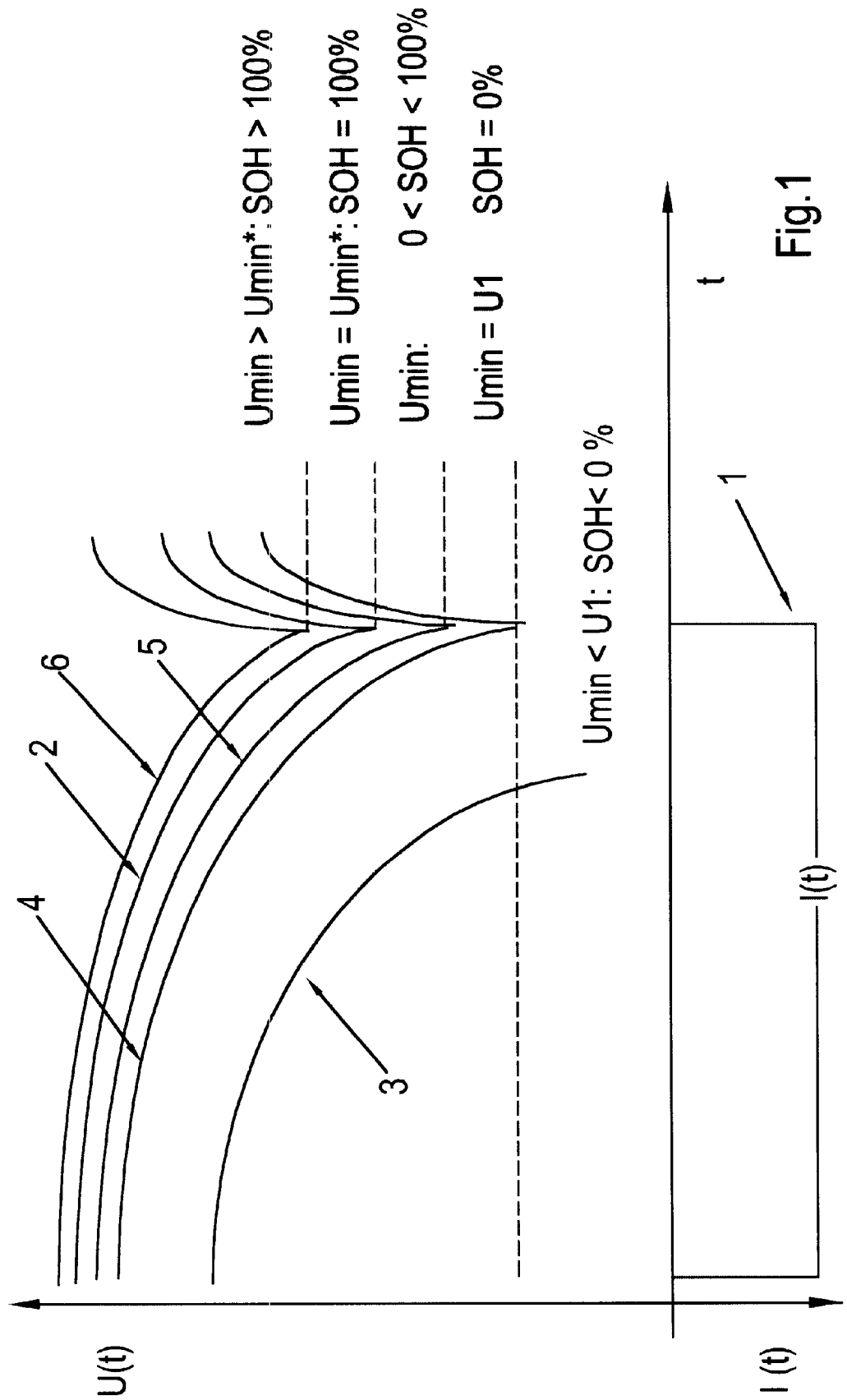

The following description is intended to refer to specific embodiments of the invention illustrated in the drawing and described herein and is not intended to define or limit the invention, other than in the appended claims.

The method according to the invention determines the fitness for use, also referred to hereinafter as "SOH" (state of health), of an electric storage battery for a specific application as a function with a continuous value range, the determined value resulting from comparison of the voltage of the storage battery during loading with a concrete load profile with a limiting value for this voltage as well as, if appropriate, the desired value (new value).

A graduated quantification of the fitness for use with a continuous value range of a measured variable SOH goes far beyond a purely binary statement the efficiency is still sufficient to fulfil the operationally determined function, or the efficiency is no long sufficient for the purpose.

The substantially constant determination of this continuously measured variable and the observation of the time variation of its value further permit the use of mathematical methods such as the formation of mean values, differentiation with respect to time, determination of points of inflection, calculation of trends and the like. This is something that is not possible in the case of discrete statements on the availability of a storage battery.

The method according to the invention evaluates the fitness for use of an electric storage battery not in a blanket fashion, but in concrete terms for a specific application. The point is that a storage battery can already no longer be suitable (that is to say the end of its service life has been reached) for a demanding application with a high power requirement or with power requirements under unsuitable operating conditions (such as, for example, low temperatures or a low state of charge), while it remains eminently suitable for less demanding applications. This differential consideration of the fitness for use ensures the respective function and simultaneously avoids premature and, therefore, unnecessary replacement of the storage battery.

A typical application of storage batteries is loading with an electric current I(t) or an electric power P(t), the load being capable of acting either in the charging direction or discharging direction, or even of comprising both directions, and its value being a function of time t. This load profile I(t) or P(t) characteristic of the concrete application is used according to the invention as criterion for quantifying the availability.

The voltage of the storage battery changes under the load I(t) or P(t), specifically to higher values in the case of charging and lower values in the case of discharging. However, the technically permissible or sensible voltage values are limited, specifically above by the maximum charging voltage of the storage battery (which depends in the individual case on the type of battery, temperature and state of charge, among other things) and below by the functionality of the component(s) which are supplied with electric power by the storage battery.

It is mostly the loading of the storage battery in the discharging direction which is considered below. However, the invention is not limited thereto but, of course, embraces loads in the charging direction as well as combinations of charging and discharging loads. In the case of discharging, there is a lower voltage threshold U1, which may not to be undershot under load I(t) or P(t), to ensure the functional reliability of a component. Thus, a storage battery whose voltage is at all times higher than U1 under this load is fit for use within the meaning of the invention. The smallest voltage value occurring under this load is denoted by Umin.

If Umin reaches precisely the threshold value U1 without undershooting it, the storage battery is assigned the fitness for use value SOH=0. In particular, a new battery has a minimum voltage value Umin=Umin* under this load, which is greater than U1: Umin*>U1. Otherwise, this new battery would itself be unsuitable in the new state for the concrete application. A storage battery with a minimum voltage value Umin* under the load is assigned the fitness for use value SOH=1 (or, alternatively, 100%).

For storage batteries with another minimum voltage value Umin under the defined load I(t) or P(t) the following fitness for use is generally assigned:

| Umin>Umin* | SOH>1 |
| Umin=Umin* | SOH=1 |
| U1<Umin<Umin* | 0<SOH<1 |
| Umin=U1 | SOH=0 |
| Umin<U1 | SOH <0, | it being possible for the sake of simplicity to perform the scaling in a linear fashion using the following formula, without thereby excluding other, nonlinear scalings from the invention: SOH=(Umin−U1)/(Umin*−U1).

These relationships are illustrated schematically in the drawing, in which curve 1 illustrates a specific current profile I(t), curve 2 the behavior of a new battery, curve 3 the behavior of a battery no longer fit for use, curve 4 the behavior of a borderline battery, and curve 5 the behavior of an as yet undamaged but no longer new battery. Curve 6 illustrates the behavior of a battery which is better than that of a battery actually specified for this purpose.

The voltage threshold U1 will generally be a constant value for the concrete application. The minimum voltage value Umin of an arbitrary battery and Umin* of a new battery under the defined load I(t) or P(t) depend, by contrast, on the temperature and the state of charge of the battery, in particular. It, therefore, forms part of this invention likewise to quantify these dependent relationships and to relate the availability value which is allocated to the storage battery to a nominal temperature To and a nominal state of charge SOCo and, if appropriate, to undertake conversions from the current state (T, SOC) to the nominal state (To, SOCo) or vice versa.

It is also part of the invention to make use of relationships between the voltage set up below the load profile I(t) or P(t), particularly the minimum voltage Umin, on the one hand, and the temperature T and the state of charge of the battery SOC, on the other hand, to obtain Umin and thereby to achieve a fitness for use value SOH which relates to an arbitrary state (T, SOC) without currently applying the load profile I(t) or P(t) electrically to the battery. It is thereby possible to obtain a current statement relating to SOH.

In particular, it is possible to use the linear formulation

U(t)=Uo (SOC, T)−Ri (SOC, T)×I(t), wherein Ri is the dynamic internal resistance, for the voltage response U(t) of the battery to the current load I(t)—without limiting the invention exclusively to this mode of procedure. If Umin=Minimum (U(t)) (Minimum (U(t)) stands for the smallest voltage value from U(t) which results from substituting I(t)), the result is a value for SOH.

In accordance with the invention, this mode of procedure produces the determination of the fitness for use of a storage battery to the measurement of the state of charge SOC, the dynamic internal resistance Ri, and the temperature of the storage battery under consideration. It is, therefore, unnecessary for the load profile I(t) to which the specification of the battery's fitness for use actually relates to be applied to the battery. Furthermore, it is not required to put the storage battery into the state of charge or to bring it up to the temperature to which the specification of the battery's fitness for use relates.

The above explanations relate to the case of a pure discharging load.

The procedure is similar in the case of a pure charging load: Umax replaces Umin, and the relationship symbols "<" and ">" are appropriately interchanged.

If the load comprises alternating charging and discharging loads, it is possible to proceed individually in steps for each section. The battery's fitness for use for the entire load profile is then the smallest of the individual fitness for use values obtained by the individual sections of the load profile.

In an embodiment of the invention, a) a load profile is specified in the form of a current profile I(t) or a power profile P(t) as a function of time t and is applied to the storage battery, b) the voltage response U(t) of the storage battery for this load profile is recorded, c) a voltage limiting value U1 is prescribed which is not permitted to undershoot (overshoot) the voltage U(t) at any time t during the application of the load profile to the storage battery, d) the storage battery is assigned the fitness for use value SOH="0" when the voltage limiting value U1 is reached at least at one instant t1 as the load profile is being applied to the storage battery, but this voltage limiting value U1 is never undershot (overshot), and e) the storage battery is assigned a fitness for use value "SOH" which is dimensioned according to the difference between the lowest (highest) voltage value Umin (Umax) as the load profile is being applied to the storage battery, and according to the voltage limiting value U1:

*SOH=f(Umin−U1) (SOH=f(Umax−U1).*

Furthermore, a storage battery is assigned a fitness for use value SOH=100% in the case of which the lowest (highest) voltage value Umin (Umax) is equal, as the load profile is being applied to the storage battery, to the value of the voltage value Umin* (Umax*) which occurs in the case of application to a new storage battery typical of and suitable for this application (that is to say it holds that Umin*>U1 (or Umax*<U1)—otherwise the type of battery is unsuitable for the load profile considered).

A storage battery is assigned a fitness for use value SOH<0% in the case of which the voltage limiting value U1 is undershot (overshot) for at least one instant, and this value SOH is dimensioned according to the difference between the lowest (highest) voltage value as the load profile is being applied to the storage battery, and according to the voltage limiting value U1:

*SOH=f(Umin−U1) (or SOH=f(Umax−U1)).*

In general, the fitness for use value SOH assigned to a storage battery is produced from the following formula: (Formula 1)

SOH=(Umin−U1)/(Umin*−U1) or (SOH=(Umax−U1)/(Umax* U1)); (Umin*−U1) (or (Umax*−U1) being a desired value which results from the behavior of a suitable storage battery typical of this application (that is to say it holds that Umin*>U1 (or Umax*<U1)—otherwise the type of battery is unsuitable for the load profile considered).

In a further embodiment of the method according to the invention, a storage battery is assigned a fitness for use value SOH which results not from measuring the smallest value Umin (the largest value Umax) by actually electrically applying to the storage battery a current load profile I(t) or a power load profile P(t), but by calculating the smallest value Umin (the largest value Umax) previously measured, calculated or estimated values of one or more of the variables of open-circuit voltage of the battery Uo, state of charge of the battery SOC, temperature of the battery T, resistance of the battery Ri and by substituting this value into the formula 1.

It is also possible to assign a storage battery a fitness for use value SOH which results not from measuring the smallest value Umin (the largest value Umax) by actually electrically applying a discharging current load profile I(t) (with I<O) to the storage battery, but by calculating the smallest value Umin by substituting the relationship Umin=Minimum (U(t)) where U(t)=Uo (SOC, T)+Ri (SOC, T)×I(t) in formula 1, wherein Ri is the dynamic internal resistance, dependent on the state of charge SOC and temperature T of the battery, of the storage battery, Uo the open-circuit voltage, dependent on the state of charge SOC and temperature T of the battery, of the storage battery, and minimum (U(t)) is the smallest voltage value which results from substituting I(t).

Finally, a storage battery can be assigned a fitness for use value SOH which results not from measuring the smallest value Umin by actually electrically applying the discharging power load profile P(t) (with P<O) to the storage battery, but by calculating by substituting the relationship Umin=Minimum(U(t))

where $$U(t) = \frac{Uo(SOC, T)}{2} + \sqrt{\frac{(Uo(SOC, T))^2}{4} - Ri(SOC, T) \times P(t)}$$

in formula 1, wherein Ri is the dynamic internal resistance, dependent on the charge state SOC and temperature T of the battery, of the storage battery, Uo the open-circuit voltage, dependent on the charge state SOC and temperature T of the battery, of the storage battery, and Minimum (U(t)) is the smallest voltage value which results from substituting P(t).

It is also possible to assign a storage battery a fitness for use value SOH which relates to a hypothetical operating state, currently not present, of the storage battery, which differs from the current operating state at least in the state of charge SOC or in the temperature T, and a) the internal resistance, the state of charge, the open-circuit voltage and the temperature of the storage battery are measured or estimated, b) the values thus obtained are used to calculate or estimate the open-circuit voltage of the storage battery, c) a correction of the open-circuit voltage Uo and of the internal resistance Ri is performed in accordance with the functional relationships Uo (SOC, T) and Ri (SOC, T) stored in a memory device such as a chip, with regard to the hypothetical operating state (SOC, T), d) a voltage response U(t) to a current load profile I(t) or a power load profile P(t) is calculated therefrom; and e) the fitness for use value SOH of the battery is determined therefrom.

During another refinement, a voltage limiting value U1 which is not overshot is replaced by one or more voltage limiting values U1i (i=1, . . . ) which are permitted to be undershot for a time interval of at most τi, but not for an interval>τi. Not only is the relationship of Umin and U1i then used to determine SOH, but the time interval τ for which it is possible that Umin<U1i is evaluated. For τ>τi, a value SOHi>0 is determined, for τ=τi a value of SOHi=0, and for τ<τi a value SOHi<0. It is also possible to establish other limiting value pairs (U1i, τi) and to calculate SOHi for these. The storage battery is then assigned the minimum of these values SOHi as SOH.

The fitness for use value SOH thus determined is used as a function of this value to introduce a measure in conjunction with the system connected to the storage battery, such as, for example, information to the operator of the system, a change in the operational management of the system, emergency operation of the system, and a shutdown of the system.

Alternatively, a fitness for use value SOH is determined and, as a function of this value and of operating states which are current or to be expected in future and which are characterized by the state of charge SOC and temperature T of the battery, a measure is introduced in conjunction with the system connected to the storage battery, such as, for example, information to the operator of the system, a change in the operational management of the system, emergency operation of the system, and a shutdown of the system.

What is claimed is:

1. A method for measuring fitness for use of a storage battery subject to electric loading comprising:
    a) determining a load profile (current profile I(t) or power profile P(t) as a function of time t, for the storage battery;
    b) recording an actual voltage response U(t) of the storage battery to the load profile or calculating a voltage response U(t) of the storage battery to the load profile; and
    c) determining a fitness for use value SOH for the storage battery based on the difference between 1) a lowest or highest voltage value Umin or Umax, respectively, during application of the load profile to the storage battery, and 2) a voltage limiting value U1, wherein U1 is a voltage value which may not be undershot when measuring Umin or overshot when measuring Umax by the voltage U (t) at any time t during which the load profile is applied to the storage battery.

2. The method as claimed in claim 1, wherein the storage battery has 1) a fitness for use value SOH=O when voltage limiting value U1 is reached at at least an instant t1 during application of the load profile to the storage battery, with the proviso that voltage limiting value U1 is not undershot, and 2) a fitness for use value SOH=100% when the lowest voltage value Umin is equal, during application of the load profile to the storage battery, to the value of voltage value Umin* for a new storage battery.

3. The method as claimed in claim 1, wherein the storage battery is assigned a fitness for use value SOH<0% when voltage limiting value U1 is undershot at at least one instant, and has a fitness for use value SOH>100% when the lowest voltage value Umin is larger during application of the load profile to the storage battery than the voltage value Umin* for a new storage battery.

4. The method as claimed in claim 2, wherein the storage battery is assigned a fitness for use value SOH<0% when voltage limiting value U1 is undershot at at least one instant, and has a fitness for use value SOH>100% when the lowest voltage value Umin is larger during application of the load profile to the storage battery than the voltage value Umin* for a new storage battery.

5. The method as claimed in claim 1, wherein the storage battery has a fitness for use value SOH which is determined from the following formula:
    SOH=(Umin−U1)/(Umin*−U1), wherein (Umin*−U1) is a selected value for a selected storage battery.

6. The method as claimed in claim 2, wherein the storage battery has a fitness for use value SOH which is determined from the following formula:
    SOH=(Umin−U1)/(Umin*−U1) is a selected value for a selected storage battery.

7. The method as claimed in claim 1, wherein the storage battery has a fitness for use value SOH determined from calculating a smallest value Umin from previously measured, calculated or estimated values of one or more of variables selected from the group consisting of open-circuit voltage of the battery Uo, battery state of charge SOC, temperature of the battery T and resistance of the battery Ri.

8. The method as claimed in claim 7, wherein the relationship
    Umin=Minimum (U(t)) where U(t)=Uo (SOC, T)+Ri (SOC, T)×I(t) is used to calculate the smallest value Umin.

9. The method as claimed in claim 7, wherein the relationship $$Umin = \text{Minimum } (U(t))$$

where $$U(t) = \frac{Uo(SOC, T)}{2} + \sqrt{\frac{(Uo(SOC, T))^2}{4} - Ri(SOC, T) \times P(t)}$$

is used to calculate the smallest value Umin.

10. The method as claimed in claim 1, wherein a correction of open-circuit voltage Uo and of internal resistance Ri is based on functional relationships Uo (SOC, T) and Ri (SOC, T) stored in a memory, wherein SOC is battery state of charge and T is temperature of the battery.

11. The method as claimed in claim 1, wherein the storage battery has a fitness for use value SOH, and as a function of this value at least one change may be introduced into operation of an electrical system connected to the storage battery.

12. The method as claimed in claim 11, wherein the change initiates an emergency condition within the system.

13. The method as claimed in claim 11, wherein the change initiates a shutdown of the system.

14. The method as claimed in claim 1, wherein several threshold values U1i are applied which are respectively permitted to be undershot for a time period≦τi, wherein a value SOHi is determined for each threshold value, and wherein the storage battery is allocated the smallest of the values SOHi thus obtained as the fitness for use value SOH.

15. The method as claimed in claim 1, wherein the storage battery has 1) a fitness for use value SOH=O when voltage limiting value U1 is reached at at least an instant t1 during application of the load profile to the storage battery, with the proviso that voltage limiting value U1 is not overshot, and 2) a fitness for use value SOH=100% when the highest voltage value Umax is equal, during application of the load profile to the storage battery, to the value of voltage value Umax* for a new storage battery.

16. The method as claimed in claim 1, wherein the storage battery is assigned a fitness for use value SOH<0% when voltage limiting value U1 is overshot at at least one instant, and has a fitness for use value SOH>100% when the highest voltage value Umax is smaller during application of the load profile to the storage battery than the voltage value Umax* for a new storage battery.

17. The method as claimed in claim 2, wherein the storage battery is assigned a fitness for use value SOH<0% when voltage limiting value U1 is overshot at at least one instant, and has a fitness for use value SOH>100% when the highest voltage value Umax is smaller during application of the load profile to the storage battery than the voltage value Umax* for a new storage battery.

18. The method as claimed in claim 1, wherein the storage battery has a fitness for use value SOH which is determined from the following formula:
    SOH=(Umax−U1)/(Umax*−U1), wherein (Umax*−U1) is a selected value for a selected storage battery.

19. The method as claimed in claim 2, wherein the storage battery has a fitness for use value SOH which is determined from the following formula:

SOH=(Umax−U1)/(Umax*−U1), wherein (Umax*−U1) is a selected value for a selected storage battery.

20. The method as claimed in claim 1, wherein the storage battery has a fitness for use value SOH determined from calculating a largest value Umax from previously measured, calculated or estimated values of one or more of variables selected from the group consisting of open-circuit voltage of the battery Uo, battery state of charge SOC, temperature of the battery T and resistance of the battery Ri.

21. The method as claimed in claim 1, wherein several threshold values U1i are applied which are respectively permitted to be overshot for a time period $\leq \tau i$, wherein a value SOHi is determined for each threshold value, and wherein the storage battery is allocated the smallest of the values SOHi thus obtained as the fitness for use value SOH.

* * * * *